(12) United States Patent
Afzali-Ardakani et al.

(10) Patent No.: US 7,521,091 B2
(45) Date of Patent: Apr. 21, 2009

(54) METHOD OF PREPARING AN EXTENDED CONJUGATED MOLECULAR ASSEMBLY

(75) Inventors: Ali Afzali-Ardakani, Yorktown Heights, NY (US); Cherie Renee Kagan, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 146 days.

(21) Appl. No.: 11/477,664

(22) Filed: Jun. 30, 2006

(65) Prior Publication Data

US 2007/0014998 A1    Jan. 18, 2007

Related U.S. Application Data

(63) Continuation of application No. 10/392,977, filed on Mar. 21, 2003, now Pat. No. 7,166,327.

(51) Int. Cl.
*B05D 3/10*    (2006.01)
*B05D 5/12*    (2006.01)

(52) U.S. Cl. .................. 427/301; 427/337; 427/407.1; 427/58

(58) Field of Classification Search .................. None
See application file for complete search history.

(56) References Cited

U.S. PATENT DOCUMENTS

| | | | |
|---|---|---|---|
| 4,933,285 A * | 6/1990 | Patton | ........................ 435/181 |
| 5,017,975 A | 5/1991 | Ogawa | |
| 5,677,545 A | 10/1997 | Shi et al. | |
| 5,751,018 A | 5/1998 | Alivisatos et al. | |
| 6,316,098 B1 | 11/2001 | Yitzchaik | |
| 6,646,285 B1 | 11/2003 | Kagan et al. | |
| 6,791,338 B1 | 9/2004 | Bratkovski et al. | |
| 6,949,762 B2 | 9/2005 | Ong et al. | |
| 2003/0111670 A1 | 6/2003 | Mistra et al. | |

(Continued)

FOREIGN PATENT DOCUMENTS

DE    19815220    3/1999

(Continued)

OTHER PUBLICATIONS

English language abstract and machine translation of DE 100 40 993 A1, generated Dec. 2, 2008.*

(Continued)

*Primary Examiner*—William Phillip Fletcher, III
(74) *Attorney, Agent, or Firm*—Ido Tuchman, Esq.; McGinn IP Law Group, PLLC

(57) ABSTRACT

A method for preparing an extended conjugated molecular assembly includes applying onto a surface of a substrate a first molecular compound G1-Molecule1-G2, where G1 includes a first functional group, G2 includes a second functional group, and Molecule1 includes a conjugated organic group bonded to G1 and G2, reacting the first molecular compound with a second molecular compound G3-Molecule2-G4, where G3 includes a third functional group, G4 includes a fourth function group, and Molecule 2 includes a conjugated organic group bonded to G3 and G4, to form on the substrate an extended conjugated molecule G1-Molecule1-Molecule2-G4, and reacting the extended conjugated molecule with an additional molecular compound at least once to further extend the molecular assembly, the fourth functional group G4 interacting with the additional molecular compound.

10 Claims, 10 Drawing Sheets

U.S. PATENT DOCUMENTS

| | | | |
|---|---|---|---|
| 2004/0161873 A1 | 8/2004 | Dimitrakopoulos et al. | |
| 2004/0191952 A1 | 9/2004 | Shtein et al. | |
| 2004/0263739 A1 | 12/2004 | Sirringhaus et al. | |

FOREIGN PATENT DOCUMENTS

| | | |
|---|---|---|
| DE | 10040993 | 7/2002 |

OTHER PUBLICATIONS

English language abstract and machine translation of DE 198 15 220 A1, generated Dec. 2, 2008.*

European Patent Office, EPO Customer Services, Supplemenatry European Search Report under Article 157(2)(a), for European Patent Application No. 04757858.8-1215 PCT/US2004008401, Jun. 6, 2007.

Bitzer T. et al., "Demonstration of an Imide Coupling Reaction On A SI(100)-2X1 Surface By Molecular Layer Deposition," Applied Physics Letters, AIP, American Institute of Physics, Melville, NY, US, vol. 71, No. 13, Sep. 29, 1997, pp. 1890-1892, XP000725823, ISSN: 0003-6951, the whole document.

Wu C-G et al., "Chemical Deposition of Ordered Conducting Polypyrrole Films On Modified Inorganic Substrates," Journal of Materials Chemistry, The Royal Society of Chemistry, Cambridge, GB, vol. 7, No. 8, Aug. 1997, pp. 1409-1413, XP000724094, ISSN: 0959-9428, the whole document.

Colvin, V.L. "Semiconductor Nanocrystals Covalently Cound to Metal Surfaces with Self-Assembled Monolayers" Journal American Chemical Society 1992, vol. 114, pp. 5221-5230.

International Search Report (in International Application PCT/US2004/008401) dated Apr. 7, 2005.

* cited by examiner

METHOD OF PREPARING AN EXTENDED CONJUGATED MOLECULAR ASSEMBLY

CROSS REFERENCE TO RELATED APPLICATIONS

This Application is a Continuation Application of U.S. patent application Ser. No. 10/392,977 which was filed on Mar. 21, 2003 now U.S. Pat. No. 7,166,327.

This Application is related to U.S. patent application Ser. No. 10/392,983 filed on Mar. 21, 2003, entitled "ELECTRONIC DEVICE INCLUDING A SELF-ASSEMBLED MONOLAYER, AND A METHOD OF FABRICATING THE SAME", assigned to International Business Machines Corporation, and incorporated herein by reference.

BACKGROUND OF THE INVENTION

1. Field of the Invention

The present invention relates to a conjugated molecular assembly, a method of fabricating the assembly, and a device including the assembly and, in particular, a conjugated molecular assembly having an extended conjugated segment.

2. Description of the Related Art

During the past three decades, renewed interest and considerable progress has been made in the synthesis and chemical and physical understanding of conjugated molecules and macromolecules. The attention is largely driven by applications of conjugated molecular assemblies in optical, optoelectronic, electronic, and sensor applications.

Most conjugated molecular assemblies include small molecules or short-chain oligomers, less than 8 monomeric units long. These small molecules may be found in nature, readily prepared by common organic synthetic techniques, and manipulated in organic solvents. 3

The nature of the π-bonding that gives rise to conjugation and the interesting physical properties is also the source of molecular rigidity and insolubility. As the size of conjugated molecules increases, they become increasingly less soluble. For example, in the homologous oligothiophene series quaterthiophene (4 thiophene monomers) is soluble, but sexithiophene (6 thiophene monomers) is not soluble. The insolubility of these assemblies can in some cases be overcome by chemically functionalizing the end or sides of conjugated molecules, but this also may change the desirable physical properties of the molecules and their assemblies.

Very long molecules (e.g., greater than 20 monomers long) are typically classified as polymers. Polymers are polydisperse and characterized by their average molecular weight. Polymer chains consist of a distribution of shorter, rigid molecular segments. This gives rise, especially when functionalized, to solubility not found in shorter molecules and oligomers, but also to a distribution in physical properties and a lack of order in polymeric thin films.

Recently, sequential synthetic routes to prepare well-defined molecules and macromolecules has been demonstrated [J. M. Tour, "Conjugated Macromolecules of Precise Length and Constitution. Organic Synthesis for the Construction of Nanoarchitectures," *Chem. Rev.* 96, 537 (1996), P. R. L. Malenfant, J. M. J. Frechet, "The first solid-phase synthesis of oligothiophenes," *Chem. Comm.*, 23, 2657 (1998).] by solution-phase chemical techniques and on resins (solid supports). While some assemblies have been synthesized, these techniques do not enable assembly onto surfaces.

Chemical functionalization of short molecules with head groups that enable the binding to and the self-assembly of molecules onto surfaces has received enormous attention. Once assembled onto a surface these molecular layers are known as self-assembled monolayers (SAMs). These molecules are typically synthesized and then allowed to self-assemble from common solvents onto surfaces. Self-assembled monolayers have received tremendous attention as etch barriers, surface layers to alter surface chemistry, and resist layers.

Conjugated SAMs have received particular interest as active layers in molecular electronic and photonic devices and have more recently been discussed as the active layers in molecular sensors. The SAMs investigated to date are typically short conjugated molecular segments as the longer molecules, which may be interesting for devices, are no longer soluble and therefore have not been investigated. Molecular electronic and memory devices are based on intramolecular charge transport and building the desired functionality, such as switching, within the molecule. Molecular sensors may also be based on changes in intramolecular charge transport arising from the detection of an analyte by a receptor that is a part of the molecule. A molecular scale transistor is a necessary component for logic applications and has often been referred to as the holy grail of molecular electronics.

To build a molecular scale transistor is no small feat. The channel length of a molecular transistor is defined by the length of the molecule. Similarly, the molecular switching medium in a memory cell or the functionalized molecule in a molecular sensor defines the interelectrode distance. In order to attain a suitable "off-state" of a molecular device in both transistors and memory cells and a measurable change in resistance in a sensor, the tunneling current between electrodes (source and drain electrodes in a transistor) must be suppressed. This places a lower limit on the channel length or cell height in transistors and memory cells, respectively, and therefore the length of the molecule at about 2.5 nm-3.0 nm [C. R. Kagan, A. Afzali, R. Martel, L. M. Gignac, P. M. Solomon, A. G. Schrott, B. Ek, "Evaluations and Considerations for Self-Assembled Monolayer Field-Effect Transistors," *Nano Letters*, 3, 119 (2003)]. The lower limit on the channel length and the length of the molecule is also constrained in a molecular field-effect transistor by electrostatics and the requirement to introduce a sufficient gate field to modulate the conductance of the molecular channel. This may also be true in a chemical field-effect transistor for sensing. The self-assembled conjugated molecules that have been investigated are typically shorter than 2.5 nm-3.0 nm.

The desired functionality of a molecular device may necessitate the incorporation of different molecular segments. The long-term vision of building the entire functionality of a molecular device within the molecule may require the introduction of different molecular species with different chemical and physical function. To date, only very simple and short conjugated self-assembled molecules have been investigated and therefore have not incorporated some of the desired molecular functionality.

Layer-by-layer assembly techniques have been used to prepare longer length scale molecular assemblies on surfaces. One of the most developed assemblies grown layer-by-layer is the layered metal phosphates and phosphonates. The films include multivalent metal ions, e.g. $Zr^{4+}$, and organic molecules terminated with an acidic functionality, such as a phosphonic acid [e.g., see Cao, Hong, Mallouk, "Layered Metal Phosphates and Phosphonates: From Crystals to Monolayers" *Acc. Chem. Res.*, 25, 420 (1992)].

Katz and co-workers have used this method to align hyperpolarizable molecules into polar multilayer films that show second-order nonlinear optical effects (e.g., see U.S. Pat. Nos. 5,217,792 and 5,326,626). A similar approach has also been extended to other materials such as polymers, natural proteins, colloids, and inorganic clusters [e.g., see Decher, "Fuzzy Nanoassemblies: Toward Layered Polymer Multicomposites," Science 277, 1232 (1997)]. This same technique has also been applied to the production of other multilayers including Co-diisocyanide, dithiols with Cu, and pyrazines with Ru [e.g., see Page, Langmuir, "Coordinate Covalent Cobalt-Diisocyanide Multilayer Thin Films Grown One Molecular Layer at a Time" 16, 1172, (2000)].

Among the existing examples, the driving force for the film progression is mainly the electrostatic interactions between polycations and polyanions. Few examples involve other types of interactions, such as hydrogen bond, covalent, or mixed covalent-ionic. Recently the inventors demonstrated the use of strong covalent interactions, rather than ionic interactions, between metals and ligands in a novel strategy to assemble nearly perfectly packed mutilayers of metal-metal bonded supramolecules and utilized this approach in molecular devices (YOR920010784US1, YOR920020094US1, C. Lin, C. R. Kagan, "Layer-by-Layer Growth of Metal-Metal Bonded Supramolecular Thin Films and Its Use in the Fabrication of Lateral Nanoscale Devices," J. Am. Chem. Soc., 125, 336 (2003) ). While there are a few examples of layer-by-layer assembly using covalent interactions, none of the examples allow for carbon—carbon bond formation.

To harness the optical, optoelectronic, electronic, and sensor properties of conjugated molecular assemblies in solid-state applications and devices, development of new methods for incorporating molecules with longer molecular lengths and with a wide range of functionality are needed. Layer-by-layer assembly methods, while attractive for the formation of extended molecular structures, have not been demonstrated for the formation of carbon—carbon bonds necessary to form the extended conjugated molecular assemblies interesting for applications.

SUMMARY OF THE INVENTION

In view of the foregoing and other problems, disadvantages, and drawbacks of the conventional assemblies and methods, it is a purpose of the present invention to provide a conjugated molecular assembly (and method of fabricating the assembly) which includes molecules with long molecular lengths (e.g., extended conjugated molecules) and allows for a wide range of functionality.

In a first aspect, the present invention includes a conjugated molecular assembly which includes a substrate, and an extended conjugated molecule attached to the substrate. The extended conjugated molecule includes a first conjugated molecule having a first functional group for attaching to the substrate, and a second conjugated molecule which is covalently linked to the first conjugated molecule.

The present invention also includes an inventive method of fabricating a conjugated molecular assembly. The inventive method includes applying a first conjugated molecule having a first functional group on a substrate, and covalently linking a second conjugated molecule to the first conjugated molecule to form an extended conjugated molecule.

Specifically, the inventive method may involve the stepwise construction of covalently linked assemblies of conjugated molecular assemblies. More particularly, the present invention provides a means for carbon—carbon bond formation of extended conjugated molecular assemblies and for the introduction of different molecular species to impart functionality into molecular assemblies.

In addition, the present invention provides an inventive molecular electronic device. The device may include source and drain regions (e.g., source and drain electrodes), a molecular medium extending therebetween, and an electrically insulating layer between the source region, the drain region and the molecular medium (this is for transistors and sensors). The device may include two electrodes interposed with a molecular medium extending therebetween (this is for memory and sensors).The inventive molecular device may be used for memory or logic or sensor devices. The molecular medium in the molecular device according to the present invention includes an extended conjugated molecular assembly which may be prepared by stepwise construction.

More specifically, the present invention provides a method for constructing assemblies of conjugated molecular assemblies of controlled length and molecular constitution on surfaces.

For example, the inventive method may include applying onto a surface of a substrate a first molecular compound represented by the formula G1-Molecule1-G2, to produce a primer layer of the first molecular compound on the substrate, where G1 includes a functional group for interacting with the surface of the substrate; G2 includes a functional group for reacting with a subsequently added molecule, and Molecule$_A$ includes a conjugated organic group bonded to G1 and G2, reacting the primer layer with a second molecular compound to produce a covalently linked molecular layer on the primer layer, the second molecular compound being represented by the formula G3-Molecule2-G4, and is capable of reacting with another functionalized molecule, to produce a sequentially grown assembly having covalently linked molecular assemblies bound to a self-assembled monolayer. The method may also include sequentially repeating reacting a second (in the sequence this would be a third molecular compound) molecular compound with G4 at least once to further extend the molecular assembly.

In another example, the inventive method includes applying onto a surface of a substrate a first molecular compound represented by the formula G1-Molecule1 to produce a primer layer of the first molecular compound on the substrate, where G1 includes a functional group capable of interacting with the surface of the substrate and Molecule1 includes a functional organic group bonded to G1, treating the end of the molecular layer G1-Molecule1 to form a compound G1-Molecule1-G2, where G2 includes a functional group for reacting with a subsequently added molecule, reacting the primer with a molecular assembly to produce a covalently linked molecular layer on the primer layer; the molecular layer being selected from the group consisting of compounds represented by the following formulas G3-Molecule2, and preparing an end of the second molecular compound with a reacting functional group as G4, where G4 includes the same or different functional group as G2, and is capable of reacting with another functionalized molecule, to produce a sequentially grown assembly having covalently linked molecules bound to a self-assembled monolayer. Further, the method may include sequentially repeating the treating the end of the molecular layer G1-Molecule1 and the preparing an end of the second molecular compound at least once to further extend the molecular assembly.

Alternatively, other methods of fabricating the inventive assembly may combine or modify portions of the above-described methods to couple molecules. These other methods may include, for example, electrostatic, hydrogen bonding, ionic, covalent, and mixed ionic-covalent interactions, which are known in the art, or by electrochemical coupling.

More particularly, the present invention provides a method for preparing an assembly having an extended conjugated assembly. For example, one example (e.g., Route A in FIG. 3) of the method includes applying onto a surface of a substrate a first molecular compound represented by the formula G1-Molecule1-G2 to produce a primer layer of the first linker compound; where G1 is selected from the group consisting of silane, phosphonic acid, hydroxamic acid, isocyanide, and thiol, G2 is selected from the group consisting of halogens, diazo, ethynyl, trialkyl tin, boronic acid, zinc halide, and hydrogen, Molecule1 is selected from the following groups represented by chemical formulas 1-11:

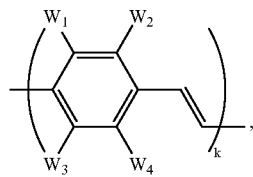

1

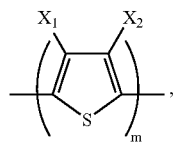

2

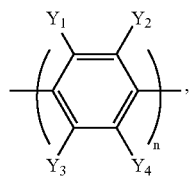

3

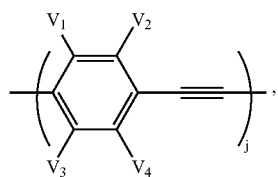

4

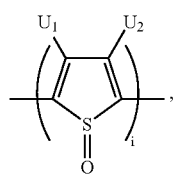

5

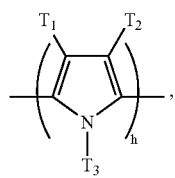

6

-continued

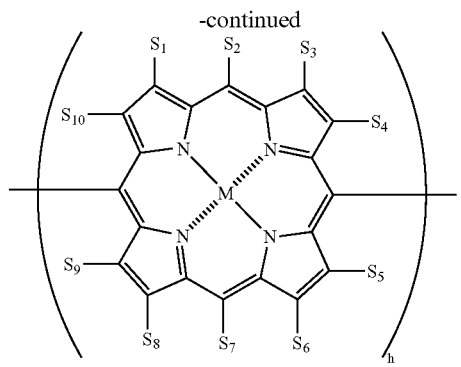

wherein M is a metal,

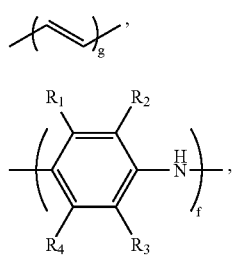

8

9

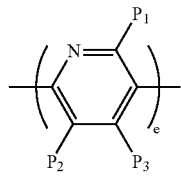

10

11 or any combination thereof. In addition, the method includes reacting the primer with a molecular assembly to produce a covalently linked molecular layer on the primer layer; the molecular layer being selected from the group consisting of compounds represented by the following formula G3-Molecule2-G4, where Molecule2 may be the same or a different molecular species as Molecule1 and selected from the groups having a chemical formula 1-11 described above, or any combination thereof, and where G4 may be the same as or different functional groups than G2, but is capable of reacting with another functionalized molecule. The method may also include sequentially repeating steps the step of reacting with another molecule at least once to produce the sequentially grown assembly having covalently linked molecular assemblies bound to the self-assembled monolayers.

Alternatively, the inventive method may include the steps of Route B in FIG. 4 which includes applying onto a surface of a substrate a first molecular compound represent by the formula G1-Molecule1, to produce a primer layer of the first linker compound; where G1 is selected from the group consisting of: silane, phosphonic acid, hydroxamic acid, isocyanide, and thiol; Molecule1 is selected from the groups having chemical formulas 1-11, as described above, or any combination thereof. In addition, the method includes treating the end of the molecular layer G1-Molecule1 to prepare G1-Molecule1-G2, where G2 is selected from the group consisting of: halogens, trialkyl tin, diazo, ethynyl, boronic acid, zinc halide, hydrogen, and vinyl, and reacting the primer with a molecular assembly to produce a covalently linked molecular layer on the primer layer; the molecular layer being selected from the group consisting of compounds represented by the following formula G3-Molecule2, where Molecule2 may be the same or a different molecular species as Molecule1 and selected from the groups having the chemical formulas 1-11, as described above, or any combination thereof, and preparing the end of the added molecular layer with a reacting functional group as G4, wherein G4 may be the same as or different functional groups than G2, but is capable of reacting with another functionalized Molecule. The method may also include sequentially repeating steps of reacting the molecule and preparing the end group at least once to produce the sequentially grown assembly having covalently linked molecular assemblies bound to the self-assembled monolayers.

The present invention further provides for an assembly having functionality introduced by constructing assemblies using different molecular species. Such assemblies can be prepared by the method according to the present invention.

The present invention also includes a molecular device which includes an extended conjugated molecular assembly according to the present invention. For example, the device may include a substrate (e.g., Au, Pd, indium tin oxide, ZrO2, $SiO_2$), a source region and drain region which are adjacent to the substrate, and a molecular medium including an extended conjugated molecule formed between the source region and drain region.

For example, the inventive molecular device may include a source region and a drain region, a molecular medium extending between the source region and the drain region, and an electrically insulating layer between the source region, the drain region and the molecular medium. The device may be modified, for instance, to include a floating electrode formed on the insulating layer between two portions of the molecular medium.

In another example, the molecular device includes a source region and a drain region, a molecular medium extending between the source region and the drain region, the molecular medium including an assembly having an extended conjugated molecular assembly (e.g., prepared by stepwise construction), a gate region disposed in spaced adjacency to the molecular medium, and an electrically insulating layer between the gate region and the source region, the drain region and the molecular medium. The device may be modified, for instance to include a floating electrode formed on the insulating layer between two portions of the molecular medium In another example, the inventive molecular device includes a source region and a drain region, a molecular medium extending between the source region and the drain region In another example, the molecular device includes a source region and a drain region, a molecular medium extending between the source region and the drain region (e.g., either vertically or laterally), the molecular medium including an assembly having an extended conjugated molecular assembly (e.g., prepared by stepwise construction), and a gate region disposed in spaced adjacency to the molecular medium, and an electrically insulating layer between the gate region and the source region, the drain region and the molecular medium With its unique and novel features, the present invention includes a conjugated molecular assembly (and method of fabricating the assembly) which includes molecules with long molecular lengths (e.g., extended conjugated molecules) and allows for a wide range of functionality. The present invention also provides an improved molecular device having improved electrical or sensor properties.

BRIEF DESCRIPTION OF THE DRAWINGS

The foregoing and other objects, aspects and advantages will be better understood from the following detailed description of preferred embodiments of the invention with reference to the drawings, in which.

DETAILED DESCRIPTION OF THE PREFERRED EMBODIMENTS OF THE INVENTION

Figure 1:
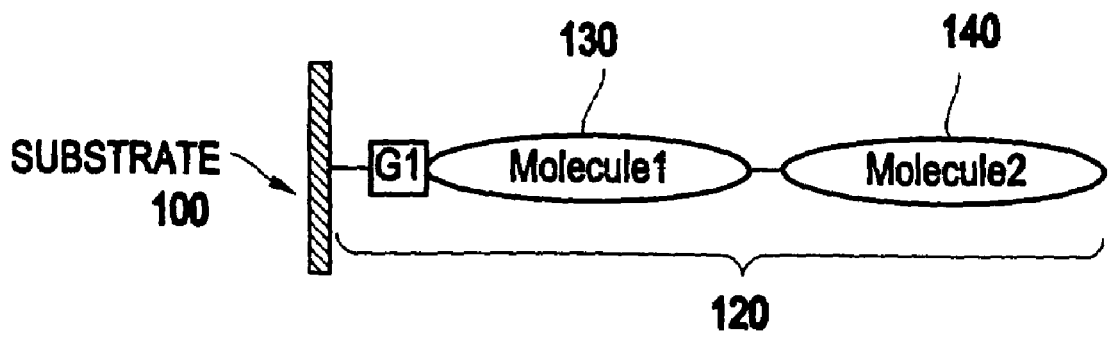
FIG. 1 illustrates a conjugated molecular assembly 100 according to the present invention.

Referring now to the drawings, FIG. 1 illustrates a conjugated molecular assembly 100 according to the present invention. As shown in FIG. 1, the inventive molecular assembly 100 includes a substrate 110, and an extended conjugated molecule 120 which includes a first conjugated molecule 130 which is formed on the substrate 110, and a second conjugated molecule 140 which is covalently linked to the self-assembled monolayer 130. Further, a functional group 150

(e.g., a head functional group) may be used to attach (e.g., bond or adsorb) the first conjugated molecule to the substrate 110.

Figure 2:
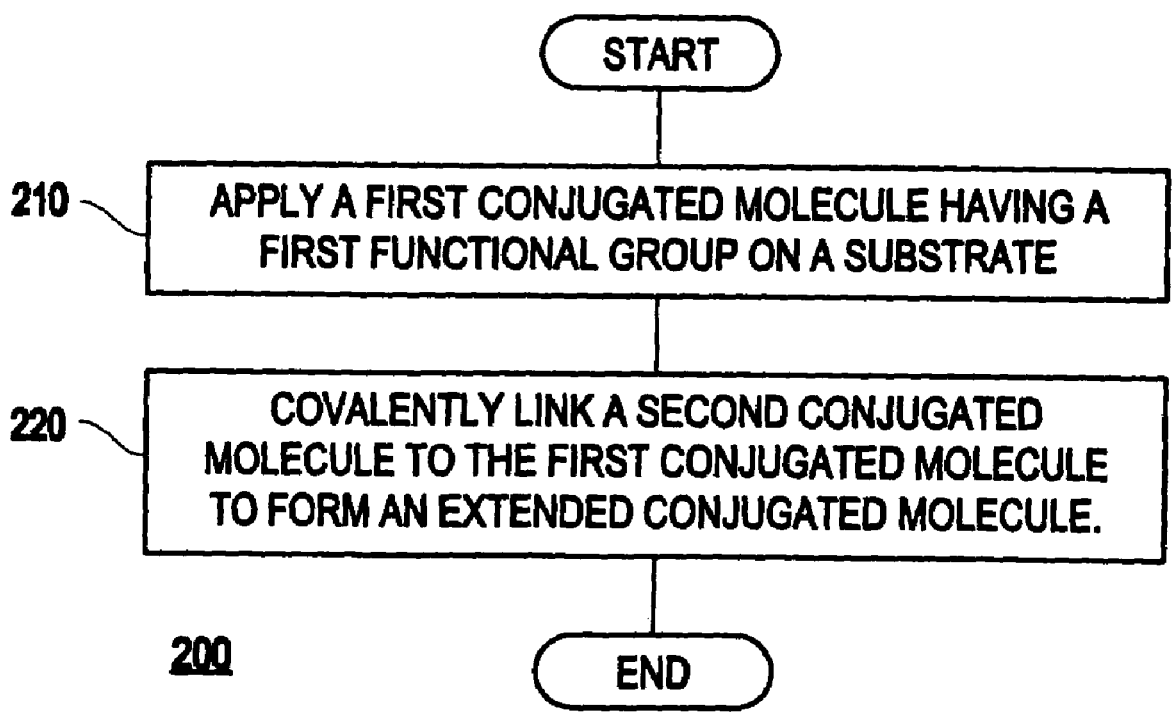
FIG. 2 illustrates a method 200 of fabricating a conjugated molecular assembly according to the present invention.

The present invention also includes an inventive method of fabricating a conjugated molecular assembly. As shown in FIG. 2, the inventive method 200 includes applying (210) a first conjugated molecule (e.g., having a first functional group) on a substrate, and covalently linking (220) a second conjugated molecule to the first conjugated molecule to form an extended conjugated molecule.

The inventive method may include the stepwise construction of conjugated molecules on a self-assembled monolayer to form a covalently linked assembly (e.g., a conjugated molecular assembly). More particularly, the assembly may be connected through carbon—carbon covalent bonds. Such a structure may have many applications in solid-state molecular electronic, optoelectronic, optical, and sensor applications.

More specifically, the inventive assembly 100 may be prepared by repeated sequential construction of small molecules to produce molecules of controlled length and chemical constitution. The inventive method 200 of fabricating the assembly may be considered self-assembling, stepwise, and tunable.

Upon application onto a substrate, the conjugated molecule of the self assembled monolayer 130 is adsorbed (or chemically bonded) on the substrate. Thereafter, at least one additional conjugated molecule (e.g., a plurality of conjugated molecules) may be added (e.g., sequentially added) end-to-end so as to form an extended segment. Thus, a layer-by-layer growth of the assemblies can be achieved by this "stepwise" approach. Further, the multi-layered assemblies can be grown layer-by-layer to the desired length.

In one exemplary embodiment, the inventive method may include:

(1) applying onto a surface of a substrate a first molecular compound represented by the formula;

G1-Molecule1-G2 to produce a primer layer of the first molecular compound on the substrate, where G1 includes a functional group capable of interacting with the surface of the substrate, G2 includes a functional group capable of reacting with an added molecule, and Molecule1 includes an organic group (e.g., conjugated molecule) bonded to G1 and G2;

the conjugated molecule being selected from the group consisting of compounds represented by the following formulas 1-11:

1

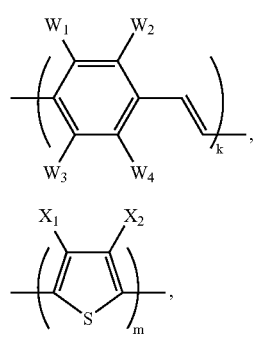

2

-continued

3

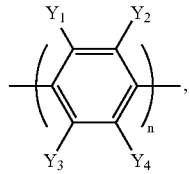

4

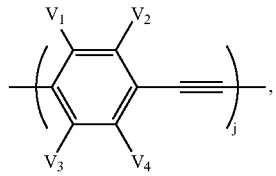

5

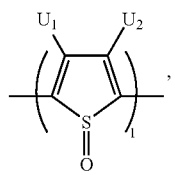

6

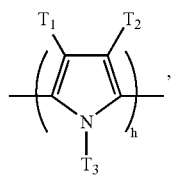

7

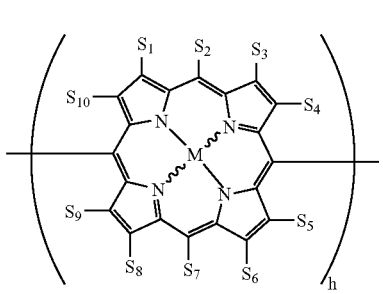 wherein M is a metal,

8

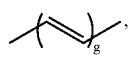

9

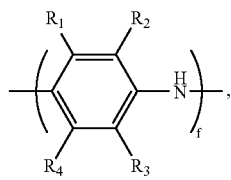

10

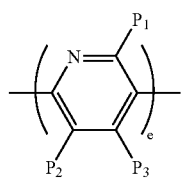

11

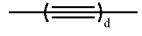

and a combination thereof; where each of R, S, T, U, V, W, X, Y, and Z is a substituent (e.g., a hydrogen, an organic group or non-organic group), and where d, e, f, g, h, i, j, k, m, n, include integers from 1 to 10;

(2) applying onto Molecule1 a second molecular compound represented by the formula:

G3-Molecule2-G4 to produce an extended conjugated molecular assembly, where G3 and G4 are the same or different functional groups capable of reacting with Molecule1-G2; and Molecule2 is an organic group (e.g., a conjugated molecule) bonded to G3 and G4. Further, Molecule2 may include an organic group selected from the above described groups having chemical formulas 1-11, and may be the same as Molecule 1 or different than Molecule1.

Further, (2) above may be sequentially repeated to produce the sequentially grown (e.g., layer by layer) assembly having covalently linked molecular assemblies bound to the self-assembled monolayers.

The length, functionality, direction of molecule vector, and other physical and chemical properties of each layer can be tuned by varying the molecules added. This feature may be used to tune the physical properties of the molecular assembly (for example absorption, fluorescene, polarizability, electronegativity, ability to hydrogen bond, coordination to metals), and also to prepare donor-acceptor compounds, redox-active assemblies, and assemblies functionalized with receptors sensitive to chemical or biological agents.

Further, these steps can be combined with other coupling reactions known in the art. Preferably, the conjugated molecular assembly 100 (e.g., the assembly) has from 1 to 60 conjugated molecular monomers.

Further, the inventive assembly 100 (e.g., assembly) may be deposited from a liquid solution and therefore, the assembly 100 may be deposited on substrates having a diverse topography and configuration.

Figure 3:
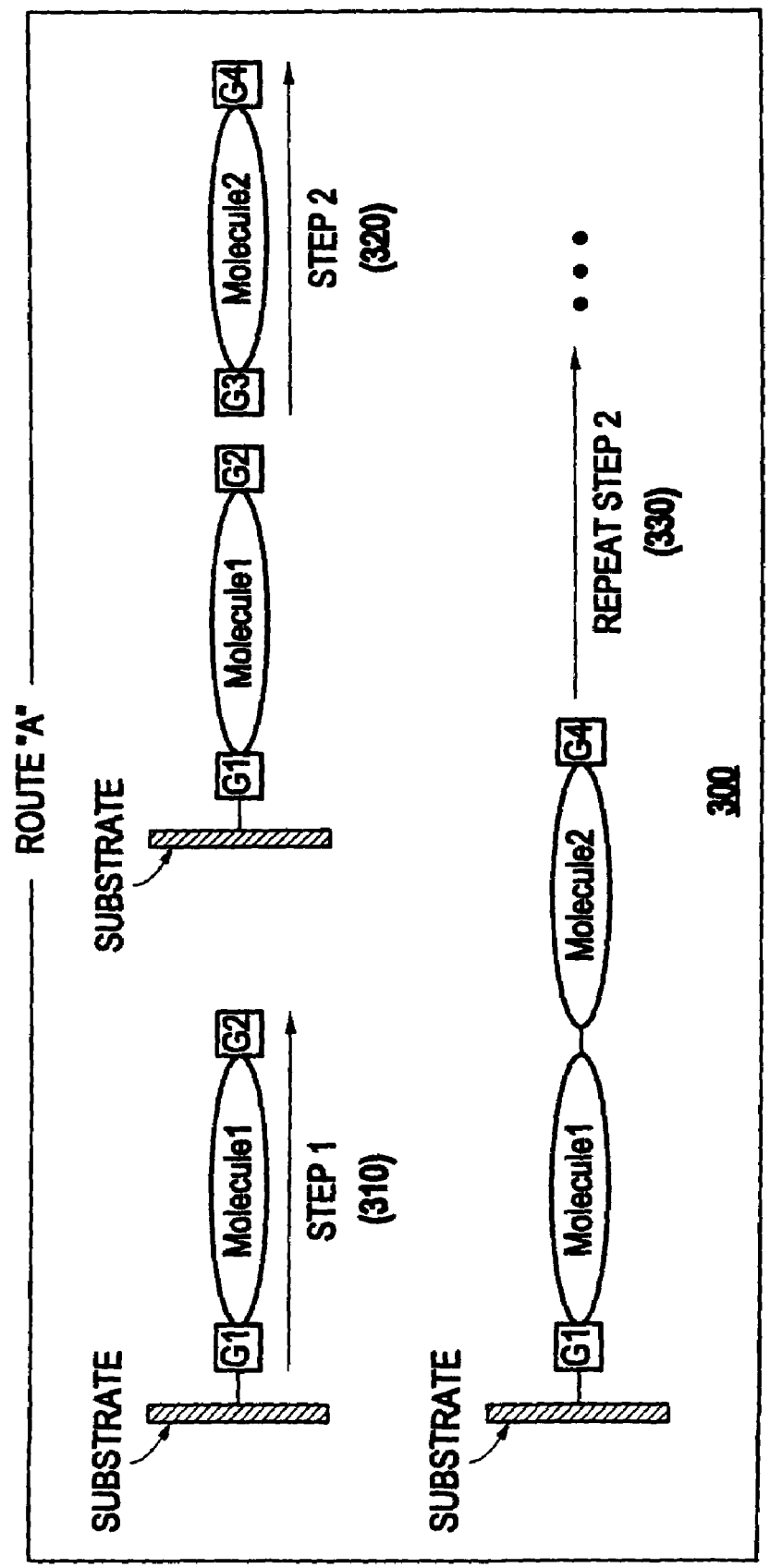
FIGS. 3-6 illustrate exemplary methods 300, 400, 500, 600 of fabricating a conjugated molecular assembly according to the present invention.

Referring again to the Figures, FIG. 3 illustrates an example (e.g., Route A) of the inventive method. Specifically, FIG. 3 illustrates a stepwise construction method which may be used according to the present invention to fabricate extended conjugated molecular compounds on a substrate. (In FIG. 3, the symbol  represents a molecule which may be reacted with another molecule to form carbon—carbon bonds therebetween).

As shown in FIG. 3, the inventive method 300 may include applying (310) a first compound G1-Molecule1-G2 to a substrate surface, applying (320) a second compound G3-Molecule2-G4 to the first compound to form on the substrate, an extended conjugated molecule G1-Molecule1-Molecule2-G4

Note that in this case, groups G2 and G3 may be selected to interact (e.g., combine) so as to be replaced with a bond between Molecule1 and Molecule2. The method 300 may also include again applying (330) a third compound G5-Molecule3-G6 (i.e., repeating step 320), in order to further extend the conjugated molecule.

Figure 4:
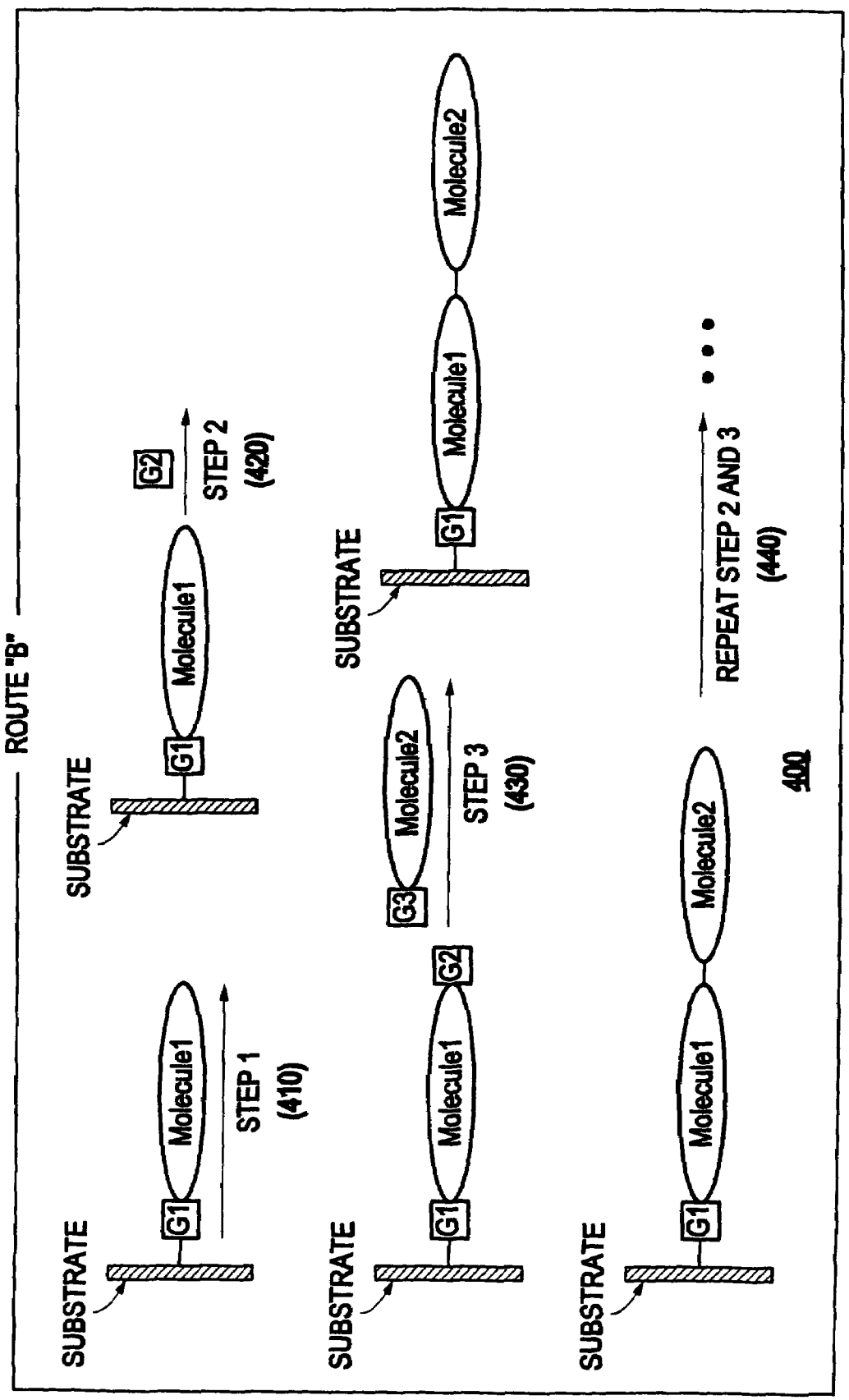

FIG. 4 illustrates another example (e.g., Route B) of the inventive method. Specifically, FIG. 4 illustrates another stepwise construction method used according to the present invention to fabricate extended conjugated molecular compounds on a substrate.

As shown in FIG. 4, the inventive method 400 may include applying (410) a first compound G1-Molecule1 to a substrate surface, applying (420) a functional group G2 (e.g,. a tail end functional group) onto Molecule1, and applying (430) a compound Molecule 2 so that Molecule 2 bonds (e.g., forms a carbon—carbon covalent bond) with Molecule1, and replaces functional group G2.

The method 400 may also include repeating (440) earlier steps (e.g., steps (420) and (430)) to further extend the extended conjugated molecule.

In addition, it should be noted that aspects of these inventive methods 300, 400 may be combined and modified to fabricate the inventive assembly. For example, steps (410) and (420) of method 400 may be performed to generate the compound G1-Molecule1-G2 on a substrate surface, Then, step (320) of method 300 may be performed to generate the compound G1-Molecule1-Molecule2-G4 on the substrate surface, and so on.

Referring again to FIG. 1, with respect to the substrate 110, any suitable material can be used. Suitable substrates include, for example, a metal, a metal oxide, a semiconductor, a metal alloy, a semiconductor alloy, a polymer, an organic solid, and a combination thereof. The form of the substrates can be a planar solid or a non-planar solid such as a stepped or curved surface.

The following preferred substrates have been demonstrated: Au, Pd, ITO, $ZrO_2$, and SiO2.

The G1-Molecule1-G2 compound is a molecular species that can form a self-assembled monolayer. Suitable compounds include organic molecular species having a functional group G1 capable of interaction with the surface of the substrate forming a coated surface.

The functional groups G1 that can be included in these compounds for interacting with or binding to a particular substate surface with chemical specificity. For example, the G1 functional group may include one or more of the same or different functional groups, such as phosphine oxide, phosphonic acid, hydroxamic acid, phosphite, phosphate, phosphazine, azide, hydrazine, sulfonic acid, sulfide, disulfide, aldehyde, ketone, silane, germane, arsine, nitrile, isocyanide, isocyanate, thiocyanate, isothiocyanate, amide, alcohol, selenol, nitro, boronic acid, ether, thioether, carbamate, thiocarbamate, dithiocarbamate, dithiocarboxylate, xanthate, thioxanthate, alkylthiophosphate, dialkyldithiophosphate or any combination thereof.

Functional group G2 is capable of reacting with the next layer of molecules (e.g., a functional group on the next layer). Specifically, this group that can be included in a molecule for interacting or reacting with a particular conjugated molecule with chemical specificity, and may include one or more of the same or different functional groups. Thus, G2 in the first linker compound can independently include a halogen or a compound having the chemical formula, $-SnR_3$ (where R is an alkyl group), $-N \equiv N$, $-C \equiv CH$, $-CH = CH_2$, $-ZnX$ (where X is a halogen), H,

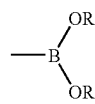

(where R can independently be a hydrogen or an alkyl group).

Further, the functional groups used to facilitate the linkage between molecules (e.g., G2, G3, and G4) may be selected from the same set of groups. However, they must be selected to facilitate the formation of the carbon—carbon bond. Thus, for example, in the method 300 discussed above, although the second and third functional groups, G2 and G3, may be selected from the same set of groups, they must be different (e.g., G2 may be a halogen, and G3 may be a —SnR₃ group, or vice versa) in order for Molecule1 and Molecule2 to be linked.

For example, compounds having the following chemical formulas 12-13 have been demonstrated to be suitable G1-Molecule1 compounds:

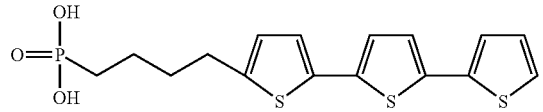

12 on oxides surfaces, and

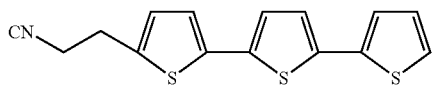

13 on Au and Pd surfaces.

The compounds having the above described chemical formulas 1-11 having a functional group G2 (e.g., X=G2) have been demonstrated to be suitable for reacting with other molecules, where R, S, T, U, V, W, X, Y, and Z are substituents (e.g., a hydrogen, or an organic or inorganic substituent), and where d, e, f, g, h, i, j, k, m, n, include integers from 1 to 10. Further, any combination of the groups having chemical formulas 1-11 would be suitable for reacting with other molecules.

Figure 5:
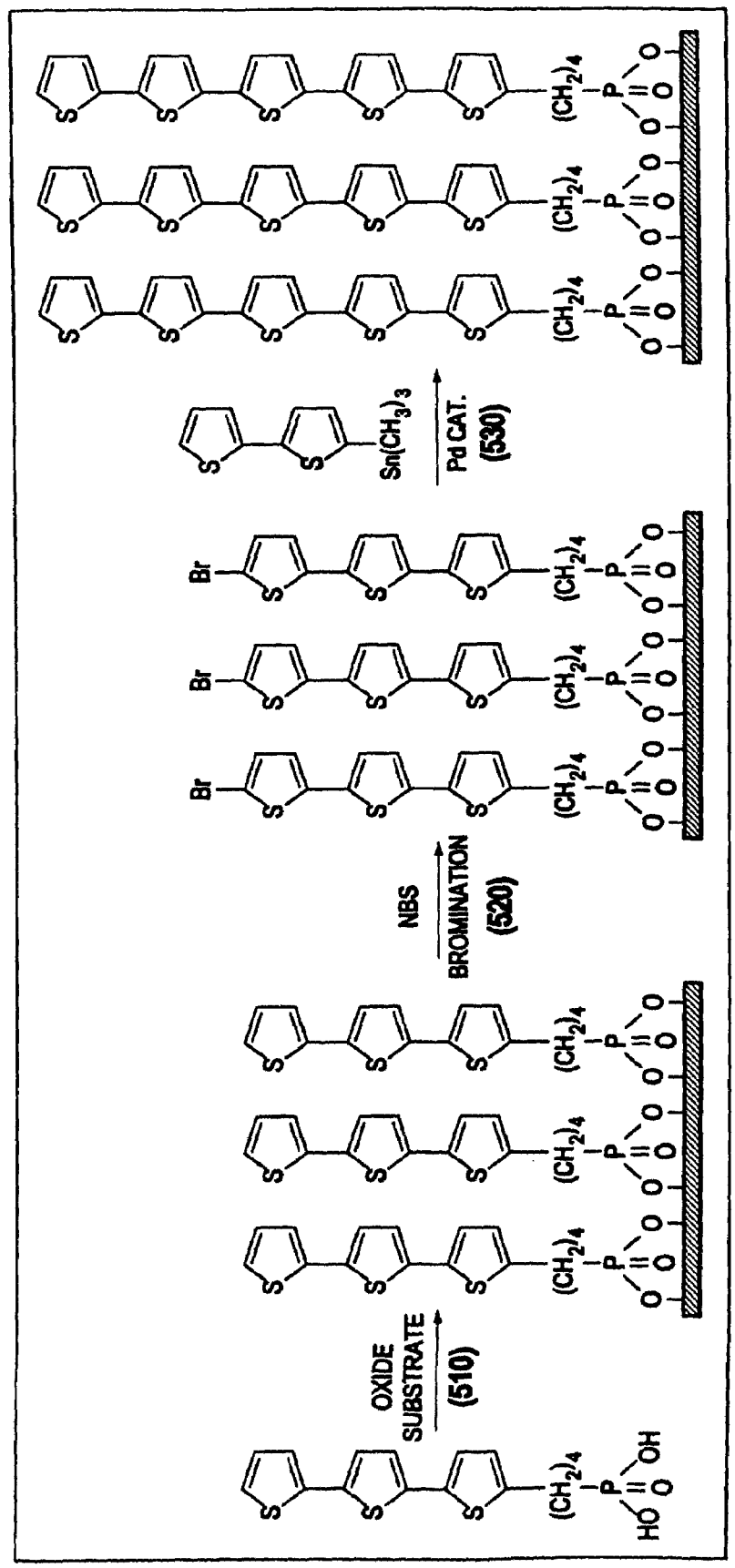

FIG. 5 illustrates a more specific exemplary embodiment of the inventive method of fabricating a conjugated molecular assembly. Specifically, FIG. 5 illustrates an example of a method of fabricating a multilayer assembly on substrates, such as quartz, indium—tin-oxide (ITO), and silicon wafers that have a native or thermally grown silicon dioxide surface. As shown in FIG. 5, the inventive method 500 includes the following:

(1) applying (510) onto a surface of an oxide substrate a first molecular compound represented by the formula 12:

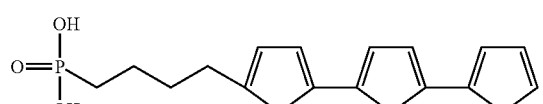

12 where the head end group (e.g., G1) is the phosphonic acid functional group;

(2) brominating (520) the molecule with n-bromosuccinimide (NBS) to form on the substrate, the compound having the following chemical formula 14:

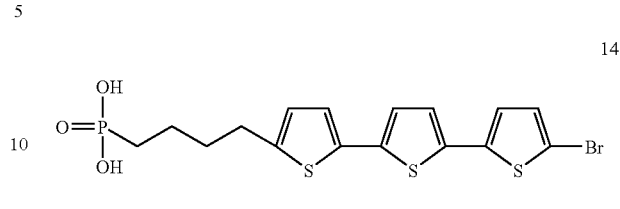

14

(3) reacting (530) the tail end group (e.g., —Br) with the compound having the following chemical formula 15:

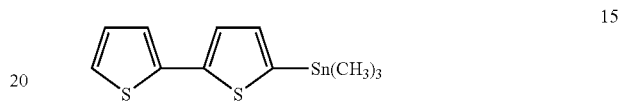

15 in the presence of a Pd catalyst to produce on the substrate, the compound having the following chemical formula 16:

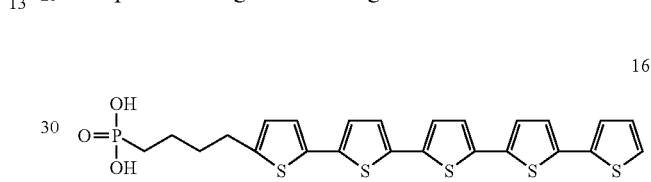

16

In addition, steps (520) and (530) above may be repeated at least once to further extend the conjugated molecular assembly.

Figure 6:
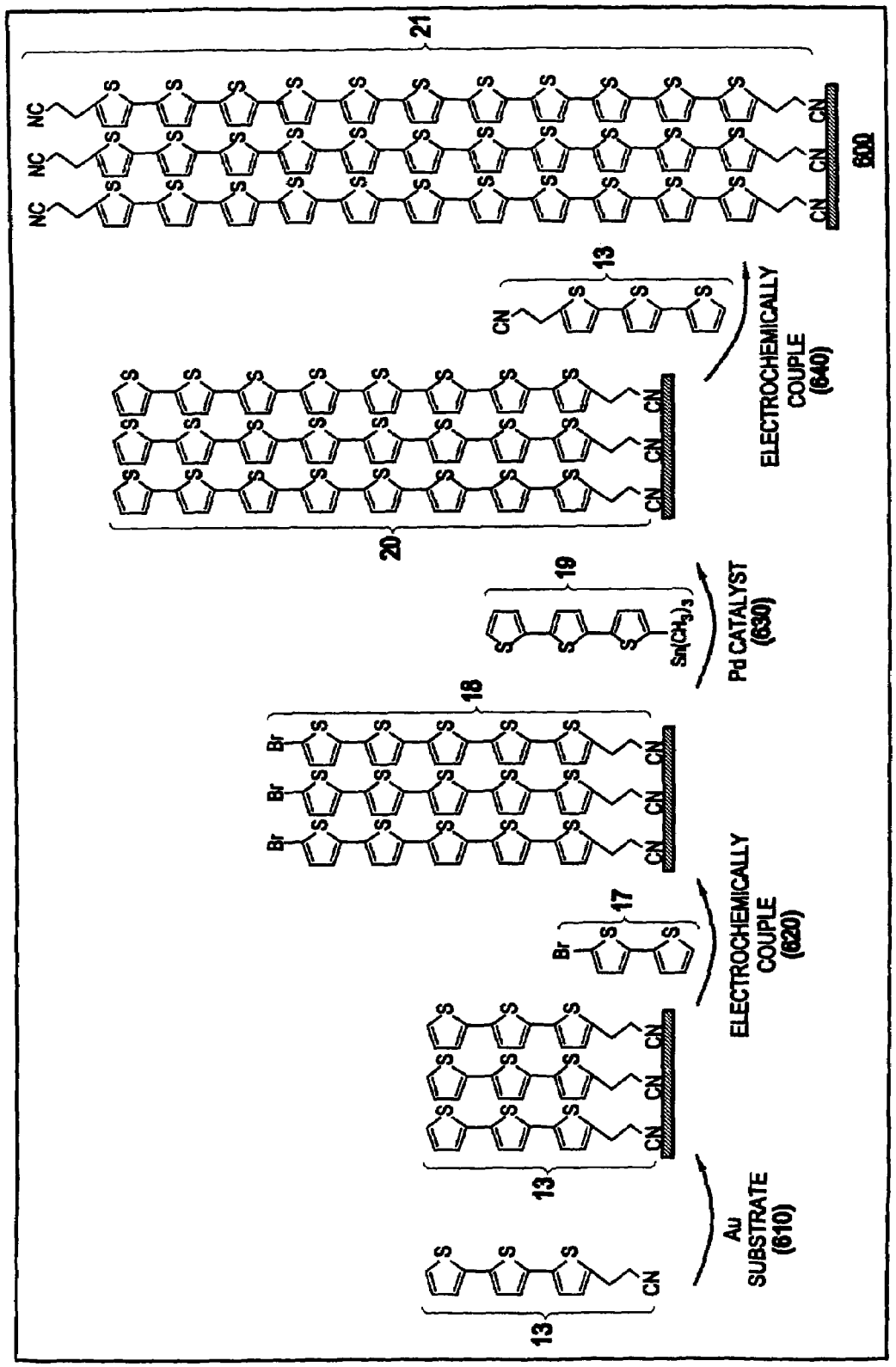

FIG. 6 illustrates more specific exemplary embodiment of the inventive method of fabricating a conjugated molecular assembly. Specifically, FIG. 6 illustrates an example of a method of fabricating a multilayer assembly on substrates, such as gold and palladium. As shown in FIG. 6, the inventive method 600 includes the following:

(1) applying (610) onto a surface of a substrate a first molecular compound represented by the chemical formula 13:

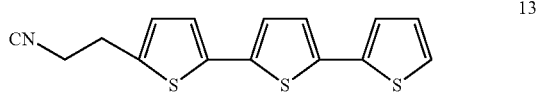

13 where G1 includes the head group isocyanide;

(2) electrochemically coupling (620) to the compound (i.e., chemical formula 13) to the compound having the chemical formula 17:

17 to construct on the substrate a compound having the following chemical formula 18:

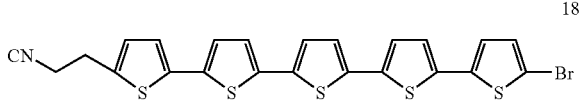

(3) reacting (630) this compound (chemical formula 18) with another molecule having the following chemical formula 19,

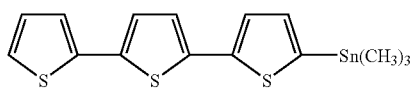

in the presence of a Pd catalyst to construct the compound having the following chemical formula 20:

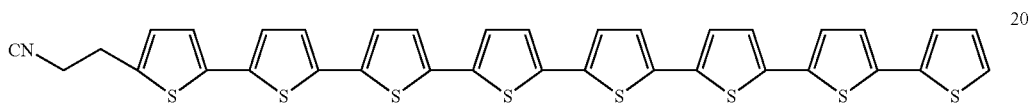

(4) electrochemically coupling (640) to this compound (chemical formula 20) to the molecule having the following chemical formula 13:

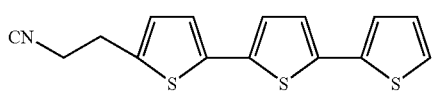

to construct on the substrate, the extended conjugated molecule having the following chemical formula 21:

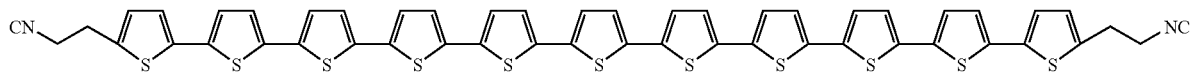

The above reaction sequences show the two general routes used to form extended conjugated assemblies using carbon—carbon bond formation. These two methods depend on the synthetic reactions used to link different molecular species. The deposition begins with the chemical modification of the substrates. The reagents used to carry out this modification are chosen so that they bear two functional groups at both ends, namely head groups and tail groups.

The head groups (e.g., G1) are chosen to chemically bind to the particular substrate surfaces. For example, the head group can be a silane, phosphonic acid, hydroxamic acid, or carboxylic acid to functionalize oxide surfaces, or a thiol/thiolate, nitrile, phosphine, sulfide, or selenide to functionalize metal or semiconductor surfaces. The tail groups will template the growth of the conjugated molecular assemblies.

In the first step, the substrates used for film growth can be various kinds of metals, insulators, and semiconductors such as glass, quartz, aluminum, gold, palladium, platinum, gold/palladium alloy, silicon, thermally grown silicon dioxide on silicon, and indium-tin-oxide coated glass. Since the films are deposited from liquid solutions, they may be deposited on substrates having diverse topography and configuration. The form of the substrates can be a planar solid or a non-planar solid such as a stepped or curved surface.

The second step of thin film deposition is to treat the modified substrate with an appropriate compound and reagents containing at least one conjugated molecule from solution. The conjugated molecules will react with the primer layer.

The next step is to repeat the above step to add additional layers, but the conjugated molecules are not required to be the same. This provides a versatile means of assembling multilayer heterostructures from various conjugated molecular building blocks, with essentially any desired sequence of layers.

Figure 7A:
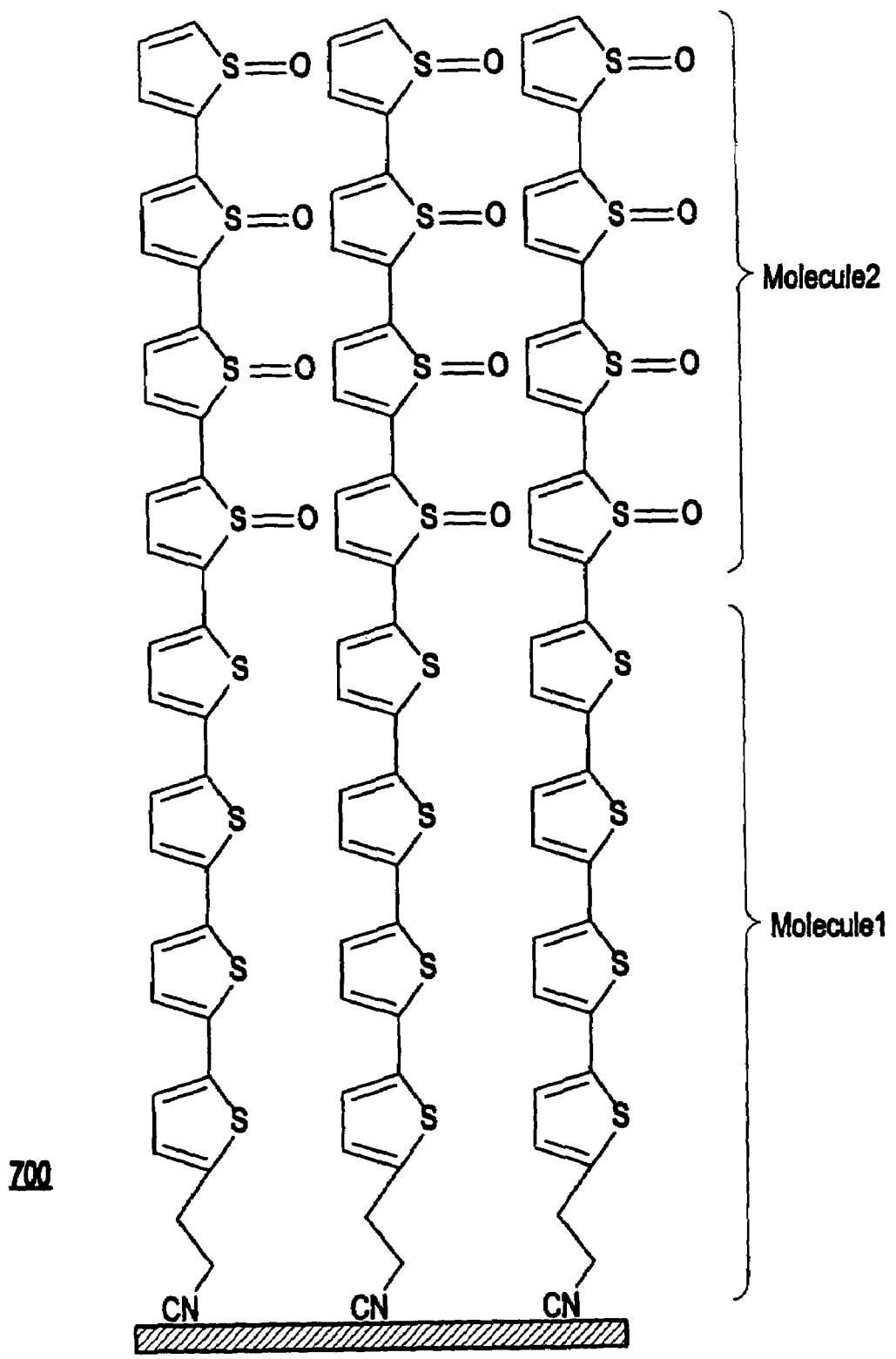
FIGS. 7A-7B illustrate examples of a donor-acceptor assembly 700, and a molecular assembly with redox-active species 750, respectively, which may be fabricated according to the present invention.

The present invention provides a means to form a versatile range of heterostructures by coupling different molecules to provide functionality. This includes donor-acceptor assemblies such as the assembling multilayers 700 which are illustrated, for example, in FIG. 7A. For example, as shown in FIG. 7A, the assemblies may include molecules which includes four thiophene monomers and a cyanide group attached to the substrate, and a molecule2 which includes 4 thiophene-s-oxide monomers.

Figure 7B:
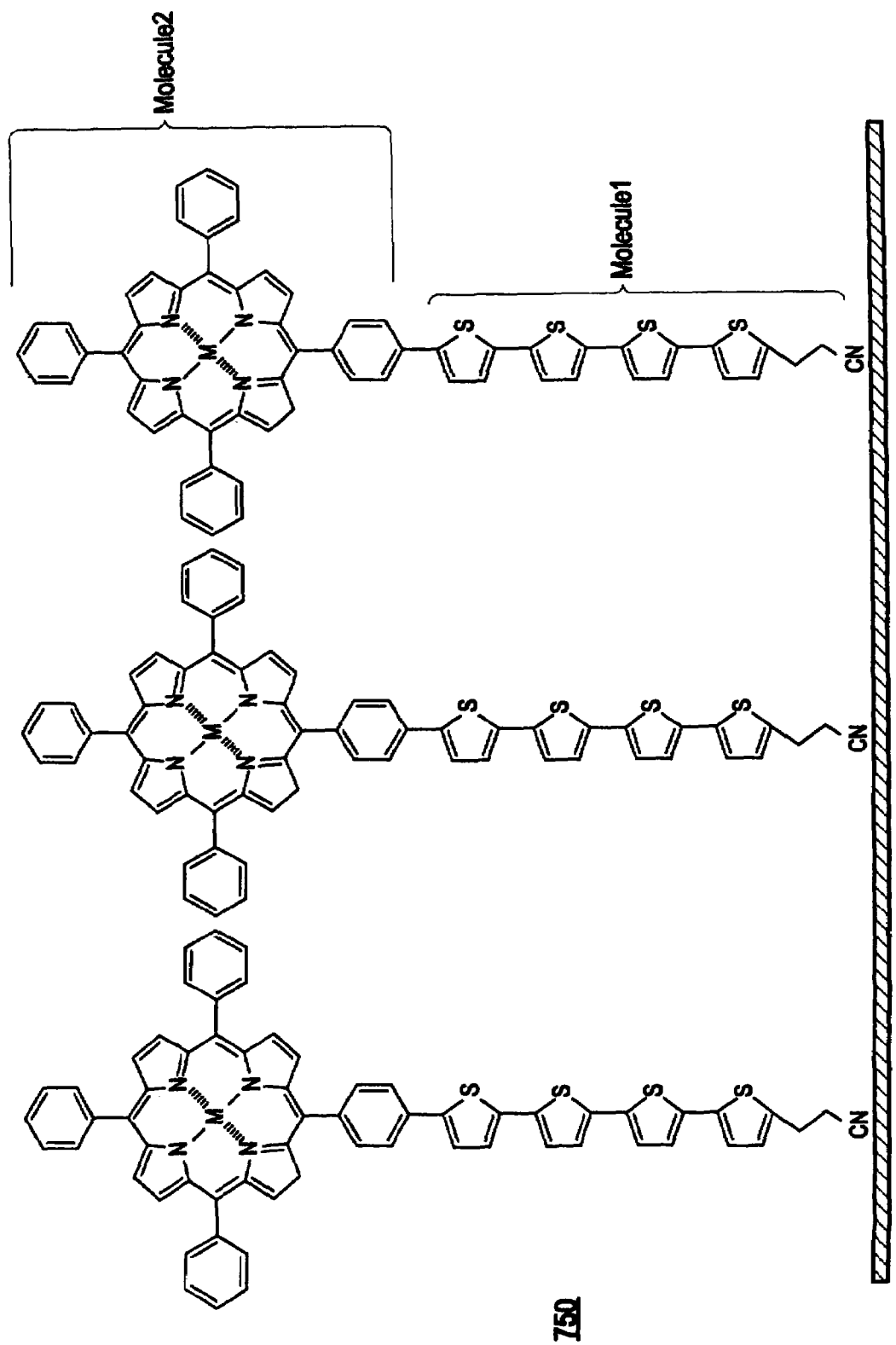

In addition, the molecular assemblies may include redox-active species such as the assembly 750 illustrated in FIG. 7B. For example, as shown in FIG. 7B, the assemblies may include molecule 1 which includes 4 thiophene monomers and a cyanide group attached to the substrate, and a molecule2 which includes a porphyrin group.

In sum, the present invention makes use of a molecular medium, which includes an extended conjugated molecule. This molecule may be prepared, for example, by stepwise construction as the active switching medium in two- and three-terminal electronic and sensor devices.

Further, the inventive conjugated molecular assembly has a well-defined length and molecular constitution. The properties of the inventive molecular assembly may be tuned by the introduction of different molecular species. As a result, these materials offer rich electrochemistry and electronic properties for electronic device applications and receptor sites for sensor device applications, while being simple and easy to fabricate at room temperature by inexpensive methods, such as low-cost deposition from solution.

Figure 8:
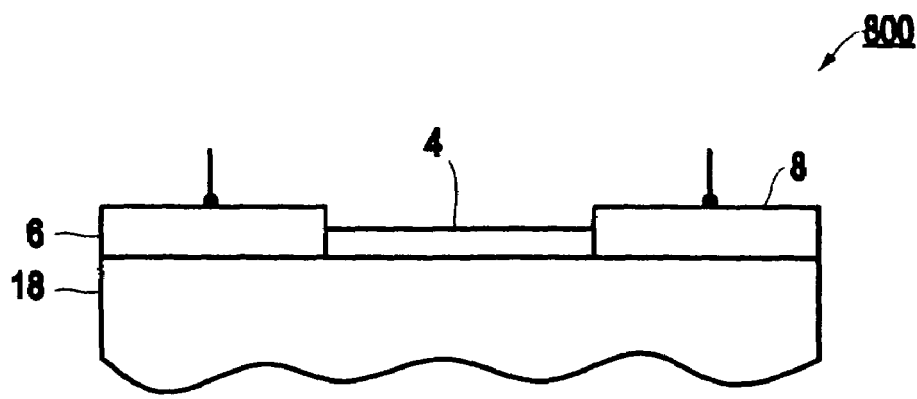
FIG. 8 illustrates a molecular device 800 (e.g., a 2-terminal lateral device structure) including an extended conjugated molecular layer as the active switching medium between two electrodes, according to the present invention.

Referring again to the drawings, FIG. 8 illustrates a molecular device 800 according to the present invention. Specifically, FIG. 8 illustrates a cross-sectional view of a two-terminal lateral electronic device 800. This device 800 includes an active switching medium layer 4 (between electrodes 6 and 8) fabricated on substrate 18, which serves as the active switching medium between electrodes 6 and 8. The active layer 4 (e.g., in combination with the substrate 18 or one or both of the electrodes 6 and 8, (e.g., where the assembly is assembled on the sidewall)) includes a conjugated molecular assembly 100 according to the present invention.

Figure 9:
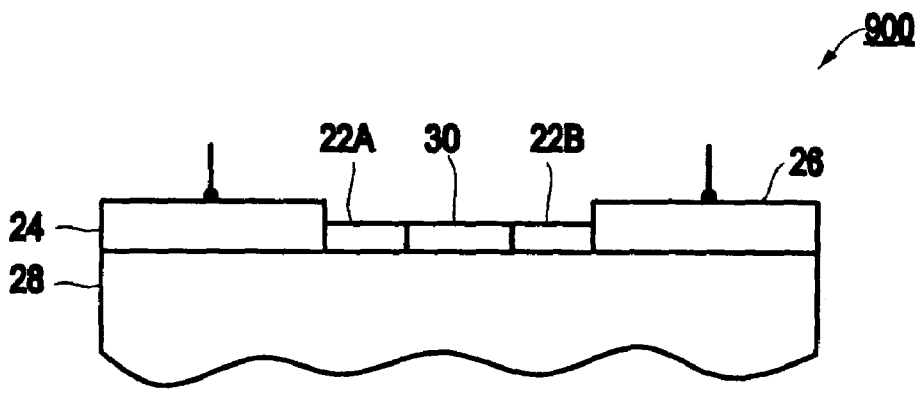
FIG. 9 illustrates a molecular device 900 (e.g., a 2-terminal lateral device structure) including an extended conjugated molecular layer as the active switching medium with a floating electrode between two electrodes, according to the present invention.

FIG. 9 shows a cross-sectional view of a two-terminal lateral device 900 according to the present invention. The device 900 includes a floating electrode 30. The device 900 also includes an active switching medium layer (between electrodes 24 and 26) fabricated on substrate 28, which has 2 portions 22A, 22B which are separated by the floating electrode 30, and serves as the active switching medium between electrodes 24 and 26. Further, the layer portions 22A, 22B (e.g., in combination with any of the electrodes 24, 26, and 30 (in this case it may be harder to selectively deposit material on the sides if its grown off the substrate, but it may be grown off the sidewalls)) includes a conjugated molecular assembly 100 according to the present invention.

Figure 10:
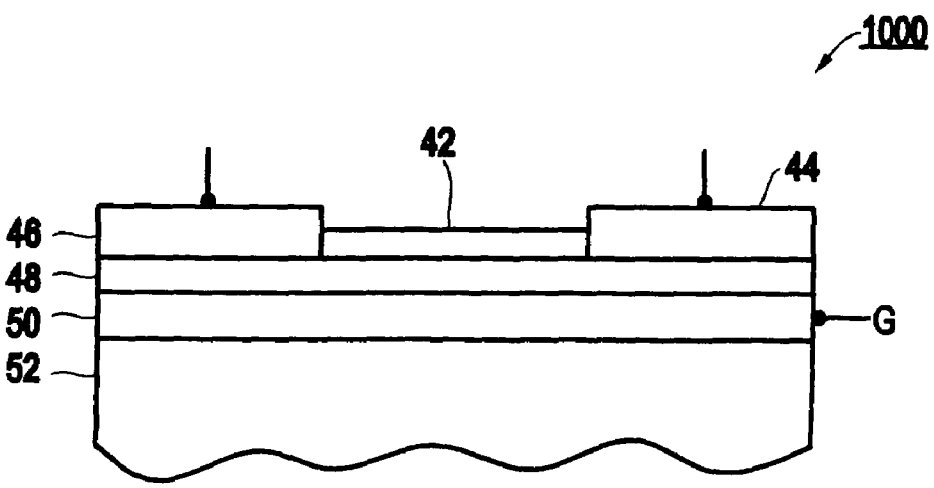
FIG. 10 illustrates a molecular device 1000 (e.g., a 3-terminal lateral device structure) including an extended conjugated molecular layer as the active switching medium between source and drain electrodes and separated from the gate electrode by an insulator, according to the present invention.

FIG. 10 shows a cross-sectional view of a three-terminal lateral electronic device 1000 in the configuration of a transistor. The device 1000 includes a conjugated molecular assembly layer 42 which (e.g., in combination with insulator 48 or one or both of the electrodes 44 and 46) includes the conjugated molecular assembly 100 according to the present invention.

Layer 42 serves as the channel between source and drain electrodes 46 and 44. The conductance of the conjugated molecular assembly may be modulated across an electrically insulating layer 48, such as a thin $SiO_2$ film, by a gate electrode 50, which may be a degeneratively doped silicon layer, all of which are fabricated on substrate 52.

Figure 11:
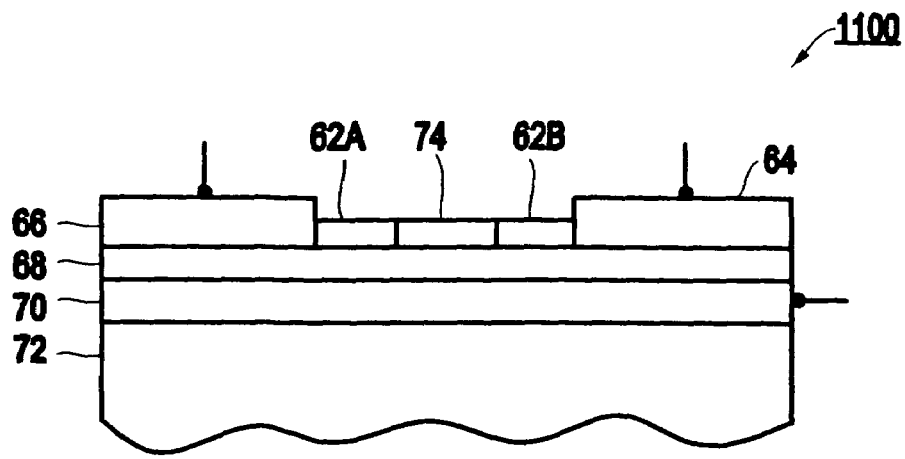
FIG. 11 illustrates a molecular device 1100 (e.g., a 3-terminal lateral device structure) including an extended conjugated molecular layer as the active switching medium and a floating electrode between source and drain electrodes and separated from the gate electrode by an insulator, according to the present invention.

FIG. 11 shows a cross-sectional view of a three-terminal lateral electronic device 1100 in the configuration of a transistor with a floating electrode 74. Layer portions 62A, 62B are portions of a conjugated molecular assembly layer which are separated by the floating electrode 74 and include (e.g. in combination with any of the electrodes 64, 66, and 74) the conjugated molecular assembly 100 according to the present invention.

Layer 62 serves as the channel between source and drain electrodes 64 and 66. The conductance of the conjugated molecular assembly layer may be modulated across and electrically insulating layer 68, such as a thin $SiO_2$ film, by a gate electrode 70, which may be a degeneratively doped silicon layer, all of which are fabricated on substrate 72.

Figure 12:
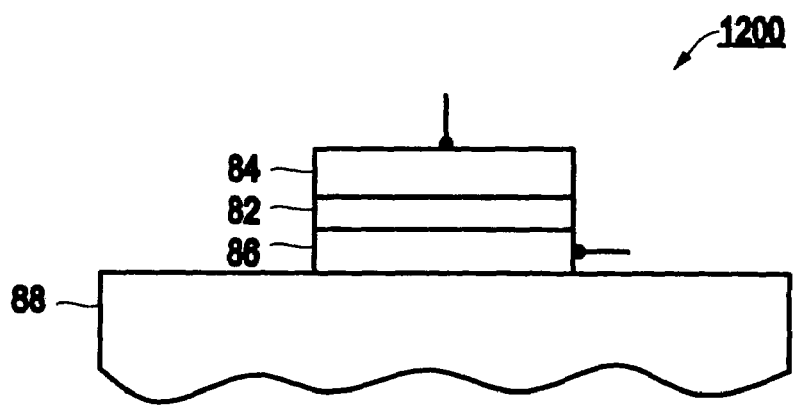
FIG. 12 illustrates a molecular device 1200 (e.g., a 2-terminal vertical device structure) including an extended conjugated molecular layer as the active switching medium between two electrodes, according to the present invention.

FIG. 12 shows a cross-sectional view of a two-terminal vertical electronic device 1200. The device 1200 includes a conjugated molecular assembly layer 82 which serves as the active switching medium between electrodes 84 and 86 fabricated on substrate 88. The layer 82 (e.g., in combination with electrode 86) includes the conjugated molecular assembly 100 according to the present invention. In this case, electrode 84 may be deposited on top of the conjugated molecular assembly.

Figure 13:
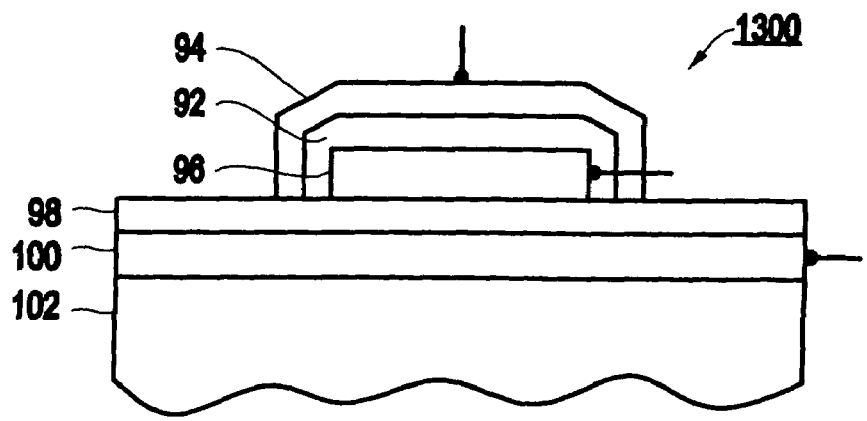
FIG. 13 illustrates a molecular device 1300 (e.g., a 3-terminal vertical device structure) including an extended conjugated molecular layer as the active switching medium between source and drain electrodes and separated from the gate electrode by an insulator, according to the present invention.

FIG. 13 shows a cross-sectional view of a three-terminal vertical electronic device 1300 in the configuration of a transistor. The device 1300 includes a conjugated molecular assembly layer 92 which (e.g., in combination with source 96) includes the conjugated molecular assembly 100 according to the present invention.

Layer 92 serves as the channel between source and drain electrodes 94 and 96. The conductance of layer 92 (e.g., the conjugated molecular assembly) is modulated across an electrically insulating layer 98, such as a thin $SiO_2$ film, by a gate electrode 100, which may be a degeneratively doped silicon layer, all of which are fabricated on substrate 102. In this case, electrode 94 may be deposited on top of the conjugated molecular assembly.

Figure 14A:
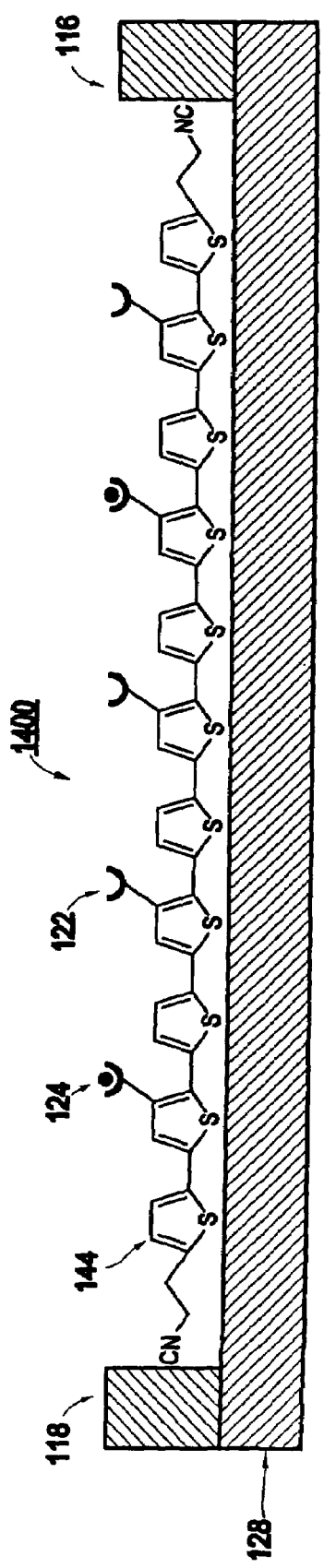
FIGS. 14A-14B illustrate a molecular sensor 1400, 1450 including an extended conjugated system functionalized with receptors as the active sensing medium between two electrodes (e.g., source and drain electrodes), according to the present invention.

FIG. 14A illustrates a cross-sectional view of a two-terminal lateral sensor device 1400 according to the present invention. This device 1400 includes an active sensing medium layer 114 (between electrodes 116 and 118) fabricated on substrate 128, which serves as the active sensing medium between electrodes 116 and 118. The active layer 114 (e.g., in combination with the substrate 128 or one or both of the electrodes 116 and 118) includes a conjugated molecular assembly 100 according to the present invention.

As shown in FIG. 14A, the conjugated molecular assembly 100 in the device 1400 may include the extended conjugated molecule represented by chemical formula 21 (described above), which is functionalized (e.g., with receptors 122 sensitive to an analyte 124) to provide a desired sensitivity.

Figure 14B:
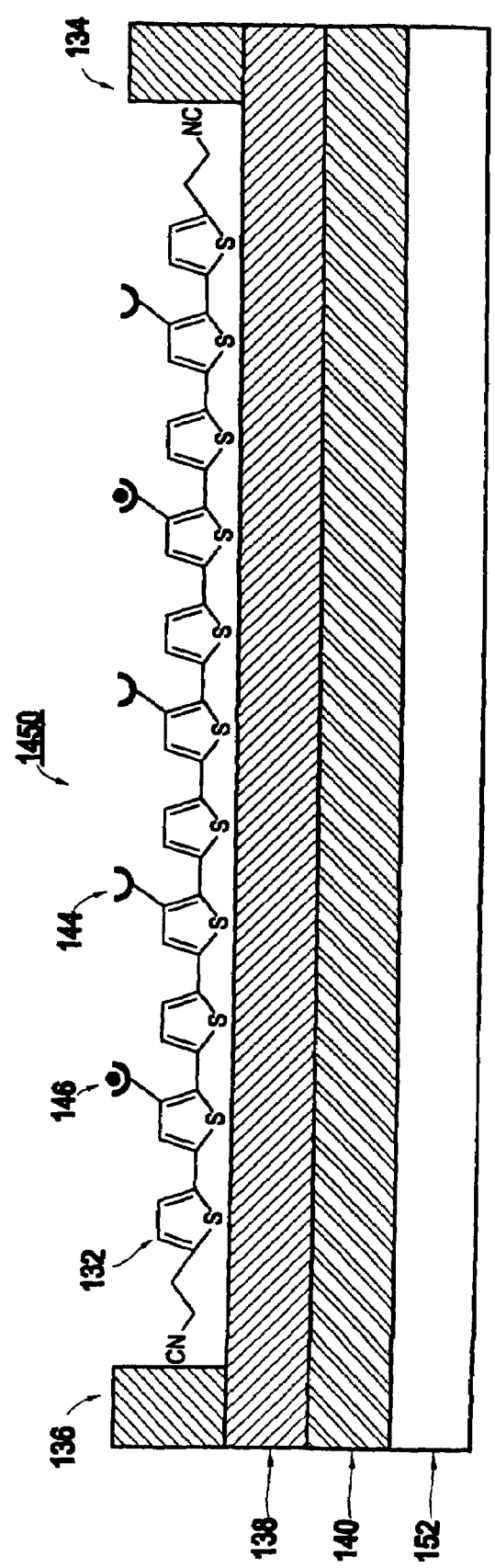

FIG. 14B shows a cross-sectional view of a three-terminal lateral electronic device 1450 (in the configuration of a transistor) in accordance with the present invention. The device 1450 includes a conjugated molecular assembly layer 132 which (e.g., in combination with insulator 138 or one of both of the electrodes 134 and 136) includes the conjugated molecular assembly 100 according to the present invention.

Layer 132 serves as the channel between source and drain electrodes 136 and 134. As shown in FIG. 14B, the conjugated molecular assembly 100 in the device 1450 may include the extended conjugated molecule represented by chemical formula 21 (described above), which is functionalized (e.g., with receptors 144 sensitive to an analyte 146) to provide a desired sensitivity The conductance of the conjugated molecular assembly may be modulated across an electrically insulating layer 138, such as a thin $SiO_2$ film, by a gate electrode 140, which may be a degeneratively doped silicon layer, all of which are fabricated on substrate 152. According to the present invention, a conjugated molecular assembly may be formed by depositing compounds from solution by stepwise construction. The low-cost, solution-based deposition is compatible with inexpensive, large area electronic applications. In addition, the low-temperature deposition conditions are compatible with a variety of substrate materials, including plastics, for flexible electronic applications.

Further, the present invention provides a molecular electronic device having an extended conjugated molecular assembly layer (e.g., an insulating layer) prepared by stepwise construction. The insulating layer may be disposed on the substrate or may be incorporated into the molecule.

With its unique and novel features, the present invention includes a conjugated molecular assembly (and method of fabricating the assembly) which includes molecules with long molecular lengths (e.g., extended conjugated molecules) and allows for a wide range of functionality. The present invention also provides an improved molecular device having improved electrical properties or sensor properties.

While the invention has been described in terms of preferred embodiments, those skilled in the art will recognize that the invention can be practiced with modification within the spirit and scope of the appended claims. Specifically, one of ordinary skill in the art will understand that the drawings herein are meant to be illustrative, and the design of the inventive assembly is not limited to that disclosed herein but may be modified within the spirit and scope of the present invention.

Further, Applicant's intent is to encompass the equivalents of all claim elements, and no amendment to any claim the present application should be construed as a disclaimer of any interest in or right to an equivalent of any element or feature of the amended claim.

What is claimed is:

1. A method for preparing an extended conjugated molecular assembly, said method comprising:

applying onto a surface of a substrate a first molecular compound G1-Molecule1-G2, where G1 comprises a first functional group, G2 comprises a second functional group, and Molecule1 comprises a conjugated organic group bonded to G1 and G2;

reacting said first molecular compound with a second molecular compound G3-Molecule2-G4, where G3 comprises a third functional group, G4 comprises a fourth functional group, and Molecule 2 comprises a conjugated organic group bonded to G3 and G4, to form on said substrate an extended conjugated molecule G1-Molecule1-Molecule2-G4; and reacting said extended conjugated molecule with an additional molecular compound at least once to further extend said molecular assembly, said fourth functional group G4 interacting with said additional molecular compound, wherein said applying said first molecular compound G1-Molecule1-G2 comprises depositing said first molecular compound from solution and bonding said first functional group G1 to said substrate, wherein at least one of said conjugated organic group Molecule 1 and said conjugated organic group Molecule 2 is selected from the group consisting of thiophene, thiophene-s-oxide, phenylene, phenylene vinylene, phenyl acetylene, acetylene, pyrrole, aniline, porphyrin, and a combination thereof, wherein said second functional group G2 is selected from the group consisting of a halogens, trialkyltin, diazo, ethynyl, boronic acid, zinc halide, hydrogen, and vinyl, and wherein said substrate comprises at least one of a metal, a metal oxide, a semiconductor, a metal alloy, a semiconductor alloy, a polymer, an organic solid and any combination thereof.

2. The method according to claim 1, wherein said reacting said extended conjugated molecule with said additional molecular compound comprises repeatedly reacting said extended conjugated molecule with said additional molecular compound in a range of 1 to 60 times.

3. The method according to claim 1, wherein a source region and drain region are formed adjacent to said substrate, and said extended conjugated molecule is formed on said substrate between said source region and said drain region.

4. The method according to claim 3, wherein said source region and said drain region comprise electrodes.

5. The method according to claim 3, wherein a gate region is formed adjacent to said substrate, and an electrically insulating layer is formed between said gate region and said source and drain regions, and wherein said extended conjugated molecule is attached to one of said electrically insulating layer, said source region, and said drain region to form an extended conjugated molecular assembly.

6. The method according to claim 1, wherein said reacting said first molecular compound comprises covalently linking second molecular compound to said first molecular compound after said first functional group G1 is bonded to said substrate.

7. The method according to claim 1, wherein said extended conjugated molecule has a length of at least 4 nm.

8. The method according to claim 1, wherein said extended conjugated molecule comprises a donor group and an acceptor group.

9. The method according to claim 1, wherein said extended conjugated molecule comprises a redox-active compound.

10. The method according to claim 1, wherein said extended conjugated molecule is functionalized with receptors sensitive to analytes.

* * * * *